United States Patent
Berens et al.

(10) Patent No.: US 7,493,551 B2
(45) Date of Patent: Feb. 17, 2009

(54) METHOD AND DEVICE FOR DELIVERING PUNCTURED CODE WORDS ENCODED WITH A LDPC CODE

(75) Inventors: Friedbert Berens, Geneva (CH); Laurent Chalard, Prangins (CH)

(73) Assignee: STMicroelectronics N.V., Amsterdam (NL)

( * ) Notice: Subject to any disclaimer, the term of this patent is extended or adjusted under 35 U.S.C. 154(b) by 512 days.

(21) Appl. No.: 11/231,656

(22) Filed: Sep. 21, 2005

(65) Prior Publication Data

US 2006/0064627 A1 Mar. 23, 2006

(30) Foreign Application Priority Data

Sep. 22, 2004 (EP) .................... 04292266

(51) Int. Cl.
*H03M 13/03* (2006.01)
*G06F 11/00* (2006.01)
(52) U.S. Cl. ........................ 714/790; 714/800
(58) Field of Classification Search ................. 714/748, 714/790, 800–801, 781
See application file for complete search history.

(56) References Cited

U.S. PATENT DOCUMENTS

| | | | |
|---|---|---|---|
| 6,877,130 B2 * | 4/2005 | Kim et al. .................... 714/790 |
| 7,178,082 B2 * | 2/2007 | Yu et al. ...................... 714/752 |
| 2003/0066014 A1 | 4/2003 | Van Dijk et al. ............. 714/774 |
| 2004/0098659 A1 | 5/2004 | Bjerke et al. ................. 714/776 |

OTHER PUBLICATIONS

Sesia et al., "The Throughput of an LDPC-Based Incremental-Redundancy Scheme over Block-Fading Channels", ITW2002, Banglore, India; Oct. 20-25, 2002; pp. 15-18; XP010620570.
Wilson, "Linear Block Codes", Digital Modulation and Coding, 1996, pp. 411-493, XP 002275914.

* cited by examiner

*Primary Examiner*—Shelly A Chase
(74) *Attorney, Agent, or Firm*—Lisa K. Jorgenson; Allen, Dyer, Doppelt, Milbrath & Gilchrist, P.A.

(57) ABSTRACT

The method and device include determining by removing $N-N_1$ rows from an original generator matrix (G) defining the LDPC code and having N rows and N–M columns for obtaining a generator sub-matrix ($G_1$) having N–M columns and $N_1$ rows. The method also includes delivering by receiving an input data vector of size N–M and multiplying the input vector with the generator sub-matrix for obtaining the punctured encoded code word.

16 Claims, 2 Drawing Sheets

METHOD AND DEVICE FOR DELIVERING PUNCTURED CODE WORDS ENCODED WITH A LDPC CODE

FIELD OF THE INVENTION

The present invention relates to the field of data communication, and more specifically to the delivering of punctured code words encoded with a Low-Density Parity-Check (LDPC) code. The invention is more particularly, but not exclusively, directed to data communication systems utilizing Automatic Repeat Request (ARQ) systems and protocols, and to hybrid ARQ (HARQ) systems.

BACKGROUND OF THE INVENTION

Low-Density Parity-Check (LDPC) codes were introduced by Gallager in 1962 and rediscovered in 1996 by MacKay and Neal. LDPC codes are also described for example in U.S. Publication 2003/0126551. For a long time they had no practical impact due to their computational and implementation complexity. This changed with advances in microelectronics that led to more computational power at hand for simulation and which now enables implementation. Due to their excellent error correction performance they are considered for future telecommunication standards.

An LDPC code is a linear block code defined by its sparse×N parity check matrix H. It contains j ones per column and k ones per row, called row and column degree respectively. A (j,k)-regular LDPC code has row and column degree of uniform weight, otherwise the code is called irregular. A parity check code can be represented by a bipartite graph. The M check nodes correspond to the parity constraints, the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation $GH^t=0$ where 0 is the null matrix. Generally, an LDPC code decoder comprises a decoding module which receives the encoded vector of length N and delivers an intermediate vector of length N by using the parity check H. Then a demapping module extracts from the intermediate vector the decoded vector of length (N−M).

More precisely, LDPC codes can be decoded using message passing processes or algorithms, either in hard or soft decision form. The decoding is then an iterative process, which exchanges messages between variable and check nodes. Typically a Belief Propagation (BP) algorithm is used, which exchanges soft-information iteratively between variable and check nodes. The code performance mainly depends on the randomness of the parity check matrix, the codeword size N and the code rate $R=(N-M)/N$.

Many publications describe LDPC decoders and the algorithm implemented therein. An example of such a publication is "VLSI Implementation-Oriented (3,k)-Regular Low-Density Check Codes", Tong, IEEE Workshop on Signal Processing Systems (SiPs), September 2001.

The channel coding part is a very important component in wireless communication systems like UMTS, WLAN and WPAN. Especially in the domain of WLAN and WPAN latency of the decoding is of a critical importance. Low Density Parity Check codes can be seen as a promising candidate for this kind of systems in the near future. These codes are being used in the future version of DVB-S and in some fiber optical communication systems. More applications will follow in the near future.

The codes have some very interesting properties, which make them a natural choice for latency critical application. In a typical wireless system the payload on the wireless channel is fixed by the modulation and the framing structure. To be able to use the wireless channel resources in the most efficient way the data stream needs to be adapted during the coding process to fit into the given constrains. A coding rate adaptation in the channel encoder does this. In existing systems, puncturing and repetition usually perform this adaptation.

U.S. Publication 2003/0126551 mentioned above proposes the LDPC codes for ARQ scheme, but in this publication a simple puncturing is used to generate the higher rate codes. The punctured bits are stored in the transmitter and only transmitted when needed. So, the complete codeword has to be generated each time leading to higher power consumption.

SUMMARY OF THE INVENTION

In view of the foregoing background, it is therefore an object of the present invention to reduce the complexity of an LDPC encoder.

Another object of the invention is to avoid modification of the conventional LDPC decoder.

Another object of the invention is to provide an additional degree of freedom to the adaptation of the wireless link to the existing link quality and the available wireless channel resources by the use of a rate adaptation of a Low Density Parity Check code. This rate adaptation should be done in a compatible way that means lower coding rates are used as the bases for higher coding rates. In this case only one low rate mother code needs to be used to generate a higher rate child code. The performance of these child codes is in general lower than the performance of the optimized codes for a given code rate but the implementation is much simpler since only one mother code for a set of child codes needs to be implemented. This is of major importance especially in the case of LDPC codes where the encoder is of a significant complexity.

Another object of the invention is to provide a method and a device allowing easy generation and implementation of such rate compatible codes.

The invention provides a method for delivering punctured code words encoded with a LDPC code. This method comprises: a determining step and a delivering step. In the determining step, $N-N_1$ rows are removed from an original generator matrix defining the LDPC code, the generator matrix having N rows and N−m columns. Thus, a generator sub-matrix having N−M columns and $N_1$ rows is obtained. In the delivering step, an input data vector of size N−M is received and the input vector is multiplied with the generator sub-matrix for obtaining the punctured encoded code words.

In other words, instead of generating a complete code word and then puncturing out bits to reach a specific target coding rate and thus number of bits, the properties of the LDPC code encoder can be used to generate only the needed bits and thus reducing the complexity of the encoder. More precisely, for a given generator matrix G with (N−M) columns and N rows the coding rate R is equal to (N−M)/N. To increase the coding rate R the number of rows has to be reduced leading to a coding rate $R_1=(N_1-M)/N_1$ where $N_1$ is smaller than N. By using this mechanism the complexity of the generator sub-matrix can be reduced depending on the needed coding rate. In the decoding process the missing samples are replaced by zero weight soft values. This is similar to the standard puncturing method. The decoder itself will not be changed.

According to an embodiment of the invention, the determining step comprises determining a set of generator sub-matrixes having respectively N−M columns and $N_1$ rows, i being a positive integer greater than or equal to 2. The determination of the generator sub-matrix of rank i+1 having $N_{i+1}$ rows comprising removing $N_i-N_{i+1}$ rows from the generator sub-matrix of rank i. And the delivering comprises selecting one of the generator sub-matrixes and multiplying the input vector by the selected generator sub-matrix for obtaining the punctured encoded code word.

In other words, by removing the rows one by another from the generator matrix, rate compatibility can be guaranteed. The mother code stays unchanged and the resulting code rate can be adapted very easily to the requirements of the wireless channel and the transmission conditions.

The same method can be used to generate the needed code words for a hybrid ARQ scheme with incremental redundancy. In a first transmission step only a part of the generator matrix is being used to generate a code word with a given coding rate. In this step only the needed parts of the matrix are used. If it is not possible to decode the packet in the first step, an additional packet will be requested by the receiver. This additional packet will contain incremental information. This incremental information will be generated in the transmitter by using a generator matrix containing only the remaining rows of the overall matrix which have not been used in the first step. Thus additional information is sent to the receiver. This additional information is being combined in the receiver with the already existing soft values. The combined received vector is then used in the next decoding attempt. By splitting the matrix into more than two parts it is easily possible to implement more than two incremental ARQ steps.

In other words, according to another embodiment of the invention particularly adapted for delivering punctured code words encoded with a LDPC code for a hybrid ARQ scheme with incremental redundancy comprising successive transmission steps of successive punctured code words, the determining step comprises determining a set of i generator sub-matrixes having respectively N−M columns and $N_i$ rows, i being a positive integer greater than or equal to 2. The $N_{i+1}$ rows of the generator sub-matrix of rank i+1 are different from the rows of any generator sub-matrix having a rank smaller than I+1. And the delivering step comprises for some successive transmission steps, respectively selecting different generator sub-matrixes and respectively multiplying successive input vectors by the successively selected generator sub-matrixes for obtaining successive punctured encoded code words.

The invention also provides a device for delivering punctured code words encoded with a LDPC code, comprising: a generator or generation means for removing $N-N_1$, rows from an original generator matrix defining the LDPC code and having N rows and N−M columns for obtaining a generator sub-matrix having N−M columns and $N_1$ rows; an input or input means for receiving an input data vector of size N−M; and a multiplier or multiplication means for multiplying the input vector with the generator sub-matrix for obtaining the punctured encoded code word.

According to an embodiment of the invention, the generation means are adapted to generate a set of i generator sub-matrixes having respectively N−M columns and $N_i$ rows, i being a positive integer greater than or equal to 2. The generation means comprises removing means for removing $N_i-N_{i+1}$ rows from the generator sub-matrix of rank i to obtain the generator sub-matrix of rank i+1 having $N_{i+1}$ rows. And the device further comprises selecting means for selecting one of the generator sub-matrixes, the multiplication means multiplying the input vector by the selected generator sub-matrix for obtaining the punctured encoded code word.

According to another embodiment of the invention adapted for delivering punctured code words encoded with an LDPC code for a hybrid ARQ scheme with incremental redundancy comprising successive transmission steps of successive punctured code words, the generation means are adapted to generate a set of i generator sub-matrixes having respectively N−M columns and $N_i$ rows, i being a positive integer greater than or equal to 2. The $N_{i+1}$ rows of the generator sub-matrix of rank i+1 are different from the rows of any generator having a rank smaller than i+1. The device further comprises selecting means adapted for some successive transmission steps, to respectively select different generator sub-matrixes. And the multiplication means are adapted to respectively multiply successive input vectors by the successively selected generator sub-matrixes for obtaining successive punctured encoded code words.

BRIEF DESCRIPTION OF THE DRAWINGS

Other advantages and features of the invention will appear on examining the detailed description of nonlimiting embodiments, and of the appended drawings in which.

DETAILED DESCRIPTION OF THE PREFERRED EMBODIMENTS

Figure 1:
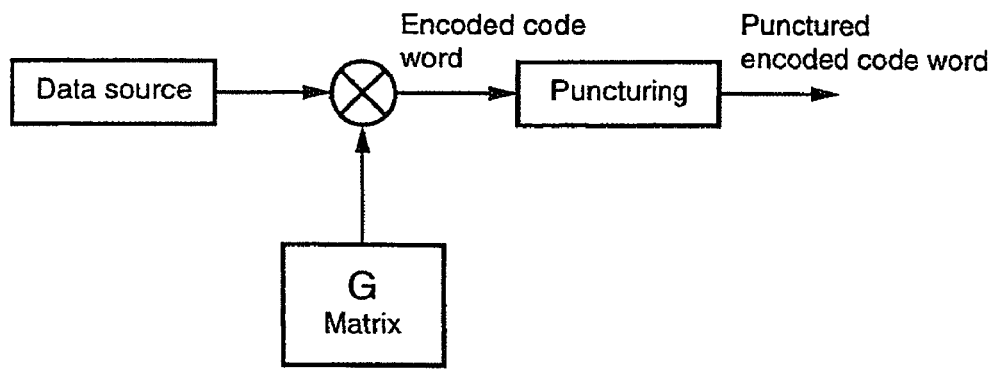
FIG. 1 is a schematic diagram illustrating a conventional puncturing scheme according to the prior art.

In FIG. 1, the conventional method of generating a punctured LDPC code is depicted. Here, a data source generates a data stream. This data stream is then multiplied by a generator matrix G defining the LDPC code and having N rows and N−M columns. The resulting code word has a coding rate R equal to (N−M)/N. In a hybrid ARQ scheme using LDPC codes and incremental redundancy a retransmission would only use a part of a punctured out needs from the first transmission. Thus, the punctured block would use a different puncturing sequence which would be orthogonal to the original puncturing sequence.

Figure 2:
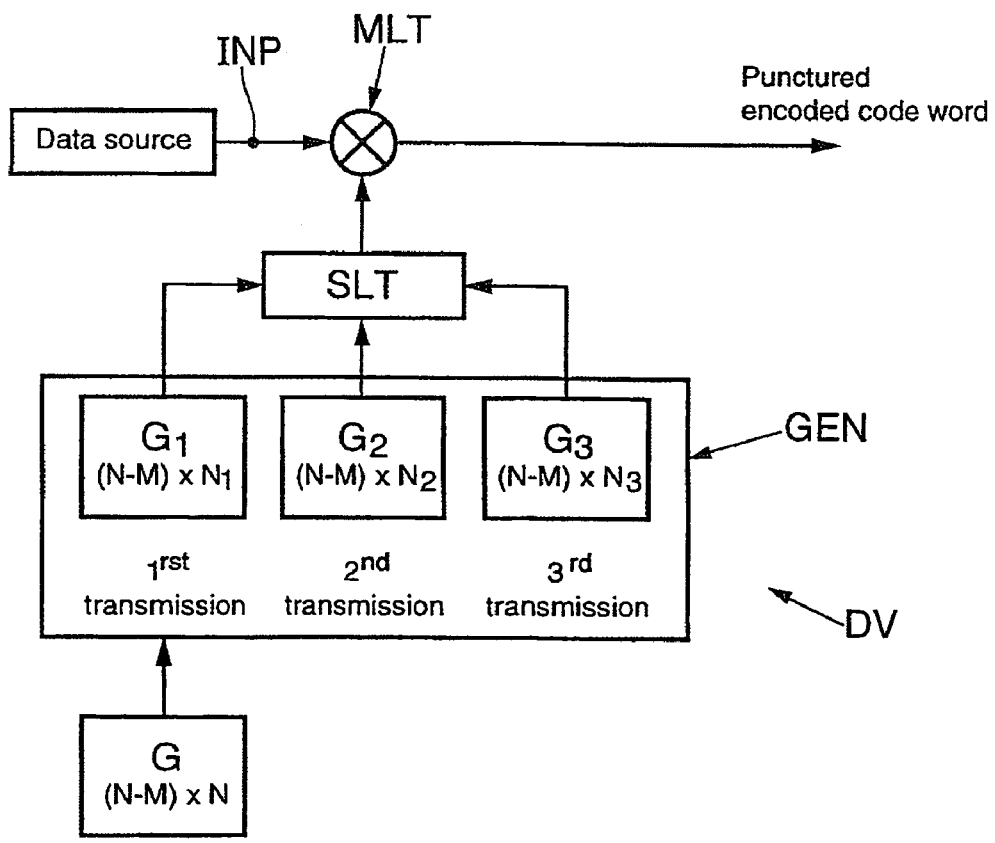
FIG. 2 is a schematic diagram illustrating a first embodiment of a device according to the invention.

In FIG. 2, a first embodiment of a device according to the invention is depicted, and can be used for example in a hybrid ARQ scheme. Here, no separate punctured unit is used. The needed code rate is directly generated by using a sub-matrix of the original G matrix. More precisely, the device DV according to the invention comprises a generator or generation means GEN, a selector or selection means SLT and a multiplier or multiplication means MLT. These means can be for example realized by software within a microprocessor or by an ASIC. Input vectors are received from a data source by an input or input means INP.

A first sub-matrix $G_1$ is generated from the original G matrix by removing $N-N_1$ rows from the G matrix. During the first transmission period, the sub-matrix G, is selected by the selecting means SLT to be multiplied with an input vector for obtaining a punctured encoded code word. In the case of incremental redundancy, in the second transmission period (first repetition) another sub-matrix is selected to generate an additional set of information symbols. This new sub-matrix $G_2$, generated by generation means from the G matrix, now contains $N_2$ rows and N−M columns, where the $N_2$ rows are not contained is the sub-matrix $G_1$. The resulting code rate $R_2$ is thus equal to $(N-M)/(N_1+N_2)$ after soft combining in the receiver.

In a second repetition step (third-transmission), another sub-matrix would be used if necessary to generate the additional symbols. The sub-matrix $G_3$ contains $N_3$ rows and N−M columns, where the $N_3$ rows are neither contained in the sub-matrix $G_1$ nor in the sub-matrix $G_2$. In the receiver, the different received values from the original transmission and the repetitions are combined and decoded in one process. In other words, the sub-matrix $G_1$-$G_3$ are generated based on the matrix G. In the case of incremental redundancy the matrices $G_1$-$G_3$ do not contain any common rows.

Figure 3:
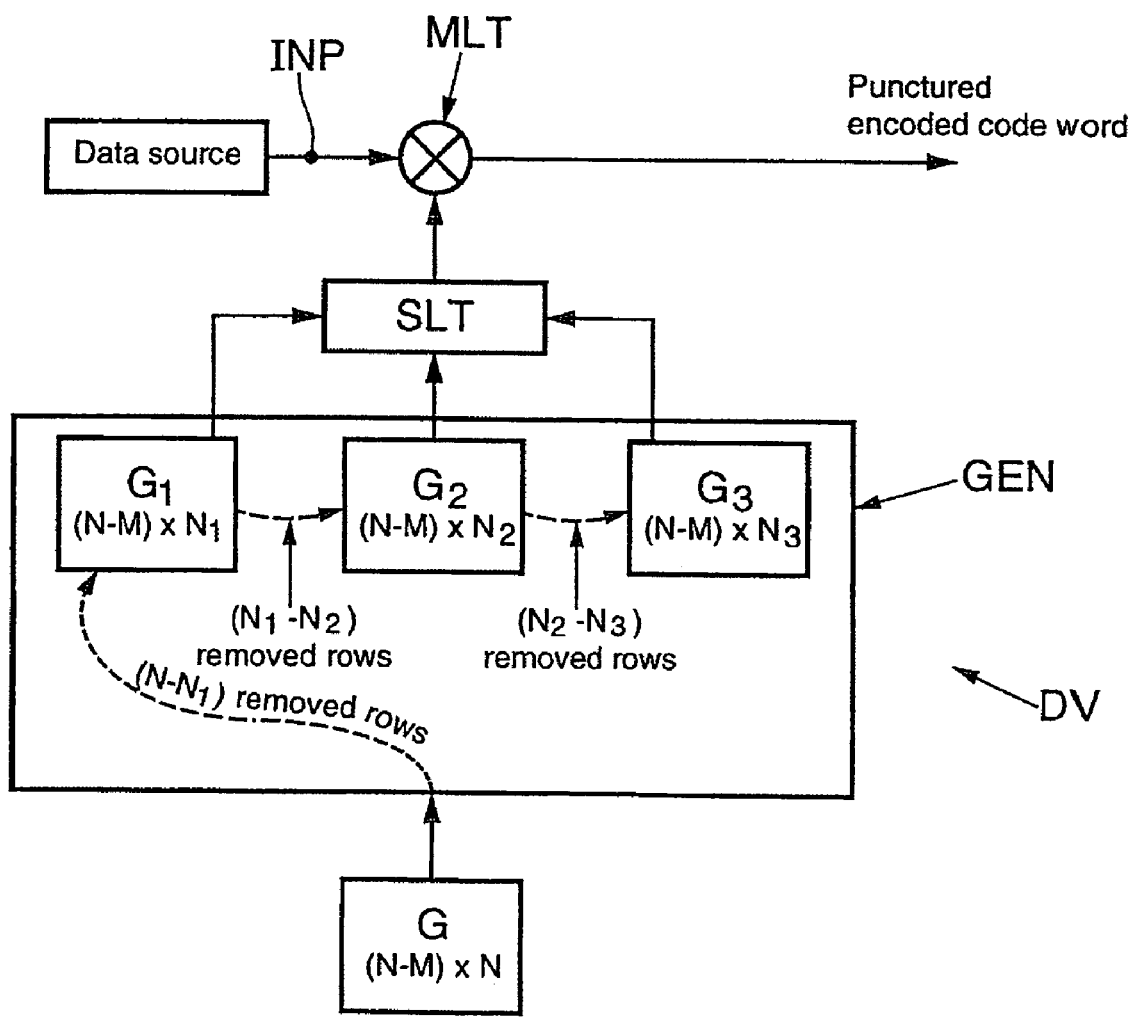
FIG. 3 is a schematic diagram illustrating another embodiment of a device according to the invention.

Another embodiment of the invention, allowing generation of rate compatible codes is now described with the reference to FIG. 3. The generation means GEN are adapted to generate a set of generator sub matrices. In the present example, i is equal to 3. And, the set of generator sub matrices $G_1$-$G_3$ is stored in a memory. The generator sub matrix has N−M columns and rows. The first generator sub-matrix $G_1$ which has $N_1$ rows, is determined by removing N−$N_1$ rows from the mother generator matrix G having N rows.

More generally, the determination of the generator sub-matrix $G_{i+1}$ of rank i+1 which has $N_{i+1}$ rows, comprises removing $N_i$−$N_{i+1}$ rows from the generator sub-matrix $G_i$ of rank i. In other words, a generator sub-matrix $G_i$ of rank i contains all rows of the generator sub-matrix $G_{i+1}$ of rank i+1 and a specific number of additional rows. The selection means SLT is adapted to select one of the generator sub-matrix stored in memory, to multiply the input vector by the selected generator sub-matrix.

It is thus possible for example to select one generator matrix and having thus a chosen coding rate R, depending on the transmission channel conditions. Whatever the embodiment of the invention (FIG. 2 or FIG. 3), although it would be possible to generate all the sub-matrixes and to store them totally in a memory together with the original G matrix, only the original G matrix is preferably stored in a memory of the device DV. And for each sub-matrix $G_i$ the index of the first row and the index of the last row of the sub-matrix $G_i$ within the G matrix are predetermined and stored in the memory or in another memory of the device and the generation means can address a sub-matrix from the G matrix by using the corresponding indexes. And these indexes are selected by the selection means depending on the rank of the repetition step (FIG. 2) or on the transmission channel conditions for example (FIG. 3).

That which is claimed is:

1. A method for delivering to a device punctured code words encoded with a Low-Density Parity-Check (LDPC) code defined by an original generator matrix having N rows and N−M columns, the method comprising:
    determining at least one generator sub-matrix having N−M columns and $N_1$ rows by removing N−$N_1$ rows from the original generator matrix; and
    delivering to the device the punctured encoded code word by receiving an input data vector of size N−M and multiplying the input data vector with the at least one generator sub-matrix.

2. The method according to claim 1, wherein determining further comprises determining a set of generator sub-matrices having respectively N−M columns and $N_i$ rows, i being a positive integer greater than or equal to 2, and including removing $N_i$−$N_{i+1}$ rows from the generator sub-matrix of rank i to obtain a generator sub-matrix of rank i+1 having $N_{i+1}$ rows; and wherein delivering comprises selecting one of the generator sub-matrices and multiplying the input vector by the selected generator sub-matrix for delivering the punctured encoded code word.

3. The method according to claim 1, wherein the punctured code words encoded with an LDPC code are for a hybrid ARQ scheme with incremental redundancy including successive transmissions of successive punctured code words; wherein determining further comprises determining a set of i generator sub-matrixes having respectively N−M columns and $N_i$ rows, i being a positive integer greater than or equal to 2, and $N_{i+1}$ rows of the generator sub-matrix of rank i+1 being different from the rows of any generator sub-matrix having a rank less than i+1; and wherein the delivering comprises successive transmissions each including respectively selecting different generator sub-matrices and respectively multiplying successive input vectors by the successively selected generator sub-matrices for delivering successive punctured encoded code words.

4. The method according to claim 1, wherein determining further comprises determining indexes of first and last rows of the at least one generator sub-matrix, and addressing the at least one generator sub-matrix based upon the original generator matrix and the indexes.

5. A method for generating for a device a code word encoded with a block code defined by a generator matrix having N rows and N−M columns, the method comprising:
    determining at least one generator sub-matrix having N−M columns and $N_1$ rows by removing N−$N_1$ rows from the generator matrix; and
    generating for the device the encoded code word based upon an input data vector of size N−M and the at least one generator sub-matrix.

6. The method according to claim 5, wherein determining further comprises determining a set of generator sub-matrices having respectively N−M columns and $N_i$ rows, i being a positive integer greater than or equal to 2, and including removing $N_i$−$N_{i+1}$ rows from the generator sub-matrix of rank i to obtain a generator sub-matrix of rank i+1 having $N_{i+1}$ rows; and wherein generating the encoded code word comprises selecting one of the generator sub-matrices and multiplying the input vector by the selected generator sub-matrix.

7. The method according to claim 5, wherein the code words are for a hybrid ARQ scheme with incremental redundancy including successive transmissions of successive code words; wherein determining further comprises determining a set of i generator sub-matrixes having respectively N−M columns and $N_i$ rows, i being a positive integer greater than or equal to 2, and $N_{i+1}$ rows of the generator sub-matrix of rank i+1 being different from the rows of any generator sub-matrix having a rank less than i+1; and
    wherein generating the encoded code word comprises successive transmissions each including respectively selecting different generator sub-matrices and respectively multiplying successive input vectors by the successively selected generator sub-matrices.

8. The method according to claim 5, wherein determining further comprises determining indexes of first and last rows of the at least one generator sub-matrix, and addressing the at least one generator sub-matrix based upon the original generator matrix and the indexes.

9. A device for delivering punctured code words encoded with an LDPC code defined by an original generator matrix having N rows and N−M columns, the device comprising:
    a generator to remove N−$N_1$ rows from the original generator matrix to obtaining at least one generator sub-matrix having N−M columns and $N_1$ rows;
    an input to receive an input data vector of size N−M; and a multiplier to multiply the input data vector with the generator sub-matrix to obtain the punctured encoded code word.

10. The device according to claim 9, wherein the generator generates a set of generator sub-matrixes having respectively N−M columns and $N_i$ rows, i being a positive integer greater than or equal to 2, the generator removing $N_i-N_{i+1}$ rows from the generator sub-matrix of rank i to obtain generator sub-matrix of rank i+1 having $N_{i+1}$ rows; and further comprising a selector to select one of the generator sub-matrixes; wherein the multiplier multiplies the input vector by the selected generator sub-matrix to obtain the punctured encoded code word.

11. The device according to claim 9, wherein the code words encoded with a LDPC code are for a hybrid ARQ scheme with incremental redundancy comprising successive transmissions of successive punctured code words; wherein the generator generates a set of generator sub-matrixes having respectively N−M columns and $N_i$ rows, i being a positive integer greater than or equal to 2, and $N_{i+1}$ rows of the generator sub-matrix of rank i+1 being different from the rows of any generator sub-matrix having a rank less than i+1; and further comprising a selector, for successive transmissions, to respectively select different generator sub-matrices; and the multiplier respectively multiplies successive input vectors by the successively selected generator sub-matrices to obtain successive punctured encoded code words.

12. The device according to claim 9, further comprising a memory to store the original generator matrix and indexes of first and last rows of each generator sub-matrix; wherein the generator addresses a generator sub-matrix based upon the indexes and the original generator matrix.

13. A device for generating a code word encoded with a block code defined by a generator matrix having N rows and N−M columns, the device comprising:

a generator to remove $N-N_1$ rows from the generator matrix to obtaining at least one generator sub-matrix having N−M columns and $N_1$ rows; and a block to obtain the encoded code word based upon an input data vector of size N−M and the at least one generator sub-matrix.

14. The device according to claim 13, wherein the generator generates a set of generator sub-matrixes having respectively N−M columns and $N_i$ rows, i being a positive integer greater than or equal to 2, the generator removing $N_i-N_{i+1}$ rows from the generator sub-matrix of rank i to obtain generator sub-matrix of rank i+1 having $N_{i+1}$ rows; and further comprising a selector to select one of the generator sub-matrixes; wherein the block comprises a multiplier that multiplies the input vector by the selected generator sub-matrix to obtain the encoded code word.

15. The device according to claim 13, wherein the code words are encoded with an LDPC code for a hybrid ARQ scheme with incremental redundancy comprising successive transmissions of successive punctured code words; wherein the generator generates a set of generator sub-matrixes having respectively N−M columns and $N_i$ rows, i being a positive integer greater than or equal to 2, and $N_{i+1}$ rows of the generator sub-matrix of rank i+1 being different from the rows of any generator sub-matrix having a rank less than i+1; and further comprising a selector, for successive transmissions, to respectively select different generator sub-matrices; and wherein the block comprises a multiplier respectively multiplying successive input vectors by the successively selected generator sub-matrices to obtain successive punctured encoded code words.

16. The device according to claim 13, further comprising a memory to store the generator matrix and indexes of first and last rows of the at least one generator sub-matrix; wherein the generator addresses the at least one generator sub-matrix based upon the indexes and the original generator matrix.

* * * * *

UNITED STATES PATENT AND TRADEMARK OFFICE
CERTIFICATE OF CORRECTION

PATENT NO. : 7,493,551 B2
APPLICATION NO. : 11/231656
DATED : February 17, 2009
INVENTOR(S) : Berens et al.

Page 1 of 1

It is certified that error appears in the above-identified patent and that said Letters Patent is hereby corrected as shown below:

| | |
|---|---|
| Column 1, Line 67 | Delete: "this kind"<br>Insert: --these kinds-- |
| Column 2, Line 10 | Delete: "constrains"<br>Insert: --constraints-- |
| Column 2, Line 49 | Delete: "N-m"<br>Insert: --N-M-- |
| Column 3, Line 43 | Delete: "I+1"<br>Insert: --i+1-- |
| Column 4, Line 43 | Delete: "out needs"<br>Insert: --out word-- |

Signed and Sealed this

Ninth Day of June, 2009

JOHN DOLL
*Acting Director of the United States Patent and Trademark Office*